US012567869B2

(12) United States Patent
Lin et al.

(10) Patent No.: US 12,567,869 B2
(45) Date of Patent: Mar. 3, 2026

(54) CALIBRATION METHOD AND CALIBRATION SYSTEM FOR SAMPLING TIME ADAPTATION IN TIME-INTERLEAVED ADC, MEDIUM, AND CALIBRATOR

(71) Applicant: Airtouch Intelligent Technology (Shanghai) Co., Ltd., Shanghai (CN)

(72) Inventors: Shuiyang Lin, Shanghai (CN); Song Qian, Shanghai (CN); Quandong Li, Shanghai (CN)

(73) Assignee: Airtouch Intelligent Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/926,355

(22) Filed: Oct. 25, 2024

(65) Prior Publication Data

US 2025/0323654 A1 Oct. 16, 2025

(30) Foreign Application Priority Data

Oct. 25, 2023 (CN) .......................... 202311392789.5

(51) Int. Cl.
*H03M 1/10* (2006.01)
*H03M 1/12* (2006.01)

(52) U.S. Cl.
CPC ......... *H03M 1/1023* (2013.01); *H03M 1/121* (2013.01); *H03M 1/1255* (2013.01)

(58) Field of Classification Search
CPC ............. H03M 1/1215; H03M 1/0836; H03M 1/1023; H03M 1/1028; H03M 1/00;
(Continued)

(56) References Cited

U.S. PATENT DOCUMENTS 6,473,013 B1 * 10/2002 Velazquez ........... H03M 1/1215
341/120
7,675,441 B2 * 3/2010 Sheng .................. H04N 5/4446
341/120
(Continued)

FOREIGN PATENT DOCUMENTS

CN 108471313 A 8/2018
CN 108832927 A 11/2018
(Continued)

OTHER PUBLICATIONS

Lu, Zhifei, A Timing Mismatch Background Calibration Algorithm With Improved Accuracy, IEEE Transactions on Very Large Scale Integration (VLSI) Systems vol. 29, Issue 8, p. 1591-1595, Jun. 10, 2021, US.

*Primary Examiner* — Linh V Nguyen
(74) *Attorney, Agent, or Firm* — IPRTOP LLC

(57) ABSTRACT

A calibration method and a calibration system for sampling time adaptation in a time-interleaved ADC, a medium, and a calibrator are provided. The calibration method comprises receiving a mismatching delay of one of sub-channels in the ADC sampling a same input signal, wherein a first sub-channel among the sub-channels is a reference channel that does not require calibration, and wherein in one sampling period, the mismatching delay of each of the remaining sub-channels is estimated based on the reference channel; receiving a sampling signal of a current sub-channel to be calibrated, wherein the current sub-channel is selected by a multiplexer; and calculating a calibration slope of the sampling signal of the current sub-channel by using a linear interpolation algorithm, and obtaining a calibrated sampling signal output by the current sub-channel, based on the mismatching delay of the current sub-channel, the calibration slope and a delay calibration coefficient.

7 Claims, 3 Drawing Sheets

(58) Field of Classification Search
CPC ............. H03M 1/0624; H03M 1/1004; H03M
1/1057; H03M 1/12; H03M 1/121; H03M
1/124; H03M 1/1245; H03M 1/004;
H03M 1/0604; H03M 1/0626; H03M
1/066; H03M 1/0663; H03M 1/0695;
H03M 1/1033; H03M 1/1042; H03M
1/1052; H03M 1/123; H03M 1/164;
H03M 1/60
USPC ......................... 341/118–120, 140, 141, 159
See application file for complete search history.

(56) References Cited

U.S. PATENT DOCUMENTS

| | | | | |
|---|---|---|---|---|
| 7,961,123 | B2 * | 6/2011 | Nagarajan ........... | H03M 1/1057 |
| | | | | 341/118 |
| 8,558,725 | B2 * | 10/2013 | Kidambi ............. | H03M 1/1052 |
| | | | | 341/118 |
| 8,749,410 | B1 * | 6/2014 | Van Der Goes ........ | H03M 1/06 |
| | | | | 341/120 |
| 9,030,341 | B2 * | 5/2015 | Tan ..................... | H03M 1/1052 |
| | | | | 341/120 |
| 9,264,059 | B2 * | 2/2016 | Tousi .................... | H03M 1/183 |
| 9,287,889 | B2 * | 3/2016 | Chiu .................... | H03M 1/0836 |
| 9,294,112 | B1 * | 3/2016 | Devarajan ........... | H03M 1/0836 |
| 9,401,726 | B2 * | 7/2016 | Ragab ................... | H03M 1/121 |
| 2007/0069937 | A1 | 3/2007 | Balakrishnan et al. | |
| 2012/0262318 | A1 | 10/2012 | Straayer | |
| 2022/0038112 | A1 * | 2/2022 | Kee ..................... | H03M 1/1245 |
| 2022/0301639 | A1 * | 9/2022 | Ngo ................... | H03M 1/0663 |

FOREIGN PATENT DOCUMENTS

| | | | |
|---|---|---|---|
| CN | | 113258930 A | 8/2021 |
| CN | | 114679176 A | 6/2022 |

* cited by examiner

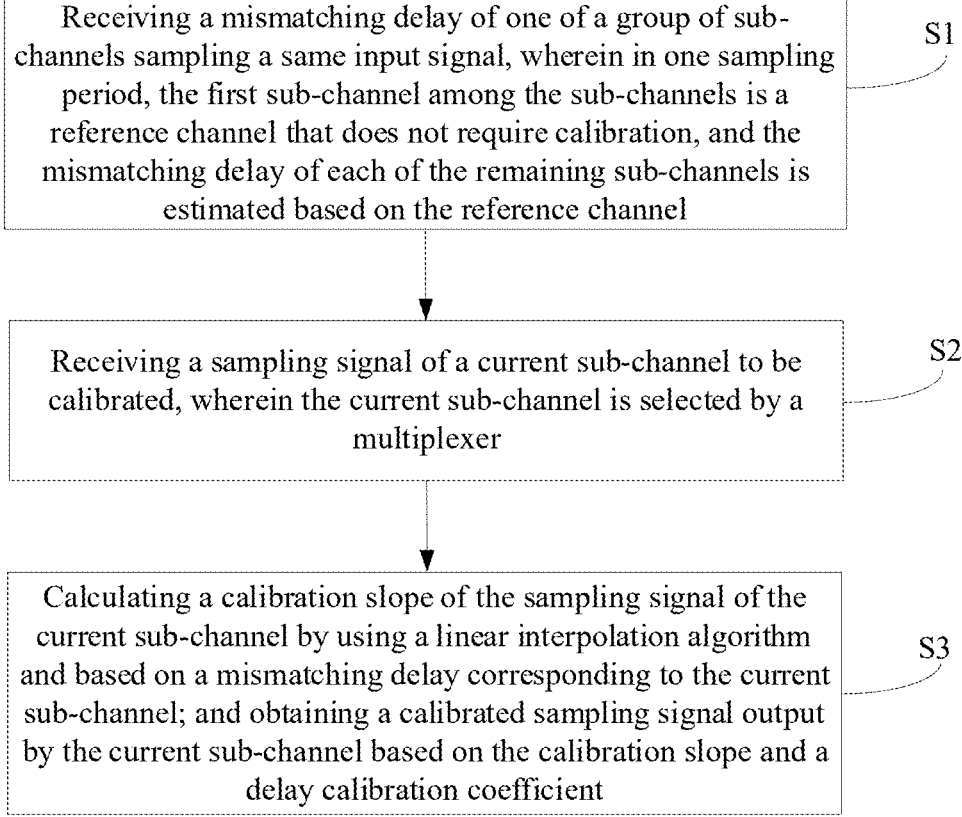

Receiving a mismatching delay of one of a group of sub-channels sampling a same input signal, wherein in one sampling period, the first sub-channel among the sub-channels is a reference channel that does not require calibration, and the mismatching delay of each of the remaining sub-channels is estimated based on the reference channel — S1

Receiving a sampling signal of a current sub-channel to be calibrated, wherein the current sub-channel is selected by a multiplexer — S2

Calculating a calibration slope of the sampling signal of the current sub-channel by using a linear interpolation algorithm and based on a mismatching delay corresponding to the current sub-channel; and obtaining a calibrated sampling signal output by the current sub-channel based on the calibration slope and a delay calibration coefficient — S3

FIG. 1

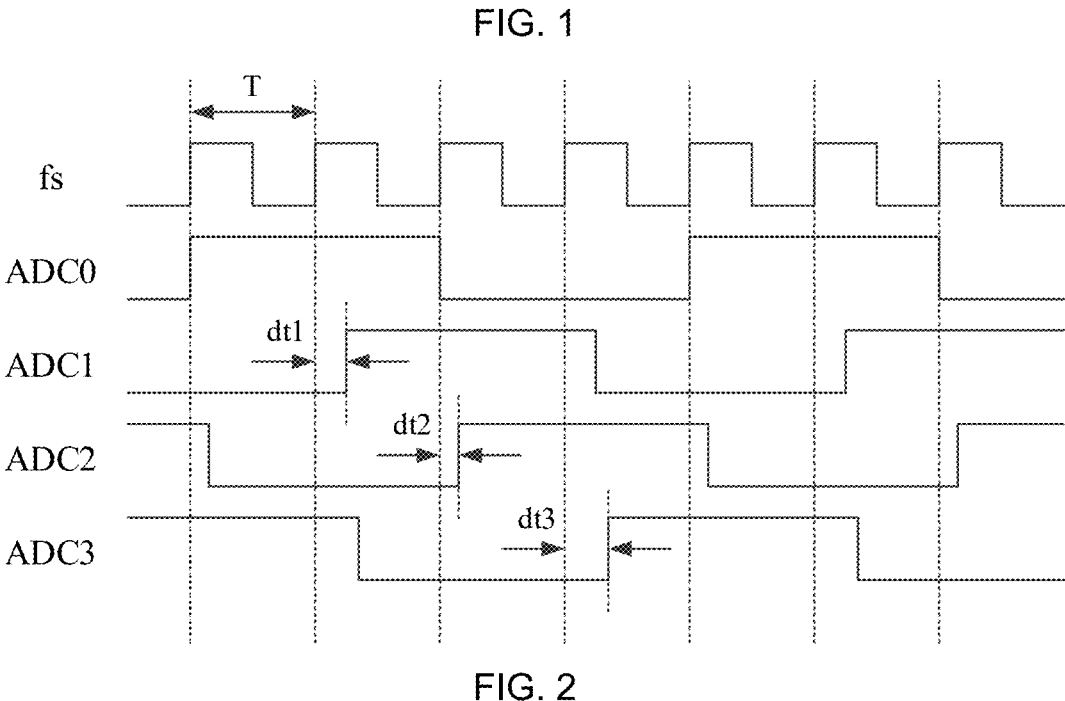

FIG. 2

CALIBRATION METHOD AND CALIBRATION SYSTEM FOR SAMPLING TIME ADAPTATION IN TIME-INTERLEAVED ADC, MEDIUM, AND CALIBRATOR

FIELD OF THE INVENTION

The present disclosure relates to the field of signal processing, and in particular, to a calibration method and a calibration system for sampling time adaptation in a time-interleaved ADC, a medium, and a calibrator.

BACKGROUND OF THE INVENTION

Time-interleaved analog-to-digital converters (ADCs) usually consist of multiple sub-channels. Each sub-channel samples the same input signal, and with precise timing control, sequentially outputs the sampled result. The multiple sub-channels have significantly boosted the effective sampling rate of the ADCs. But due to factors from manufacturing variations, certain mismatching's occurred between sub-channels in time-interleaved ADCs such as the gain mismatching's and sampling time mismatching's. These mismatching's can severely degrade ADC performance. Calibrating the sampling time mismatching's is especially tough and often involves using fractional delay filters. Traditional fractional delay filtering methods, however, face limitations like narrow input signal bandwidth and restrictions from the mismatching sub-channel sampling rates. Although more advanced algorithms can increase input signal bandwidth, they come with high complexity and hardware implementation challenges.

SUMMARY OF THE INVENTION

The present disclosure provides a calibration method and a calibration system for sampling time adaptation in a time-interleaved ADC, a medium, and a calibrator, which address issues related to the narrow input signal bandwidth, restrictions due to sub-channel sampling rates, and hardware implementation challenges, caused by various mismatching's between sub-channels in time-interleaved ADCs.

A first embodiment of the present disclosure provides a calibration method for sampling time adaptation in a time-interleaved ADC, the method comprising: receiving a mismatching delay of one of a group of sub-channels in the ADC sampling a same input signal, wherein a first sub-channel among the sub-channels is a reference channel that does not require calibration, and wherein in one sampling period, the mismatching delay of each of the remaining sub-channels is estimated based on the reference channel; receiving a sampling signal of a current sub-channel to be calibrated, wherein the current sub-channel is selected by a multiplexer; and calculating a calibration slope of the sampling signal of the current sub-channel by using a linear interpolation algorithm, and obtaining a calibrated sampling signal output by the current sub-channel, based on the mismatching delay of the current sub-channel, the calibration slope and a delay calibration coefficient.

In some examples of the present disclosure, the method further comprises acquiring a mismatching delay by taking a ratio of a delay time to the sampling period, wherein the mismatching delay uses a sampling point as a unit.

In some examples of the present disclosure, calculating the calibration slope of the sampling signal of the current sub-channel comprises: obtaining a linear slope of a sampling signal of a previous sub-channel and a linear slope of a sampling signal of a next sub-channel, respectively; calculating a characteristic value of the linear slope of the sampling signal of the previous sub-channel as a calibration slope of the sampling signal of the previous sub-channel, and a characteristic value of the linear slope of the sampling signal of the next sub-channel as a calibration slope of the sampling signal of the next sub-channel, respectively.

In some examples of the present disclosure, obtaining the characteristic values of the linear slopes of the sampling signals of the previous and next sub-channels comprises: calculating one or more of an arithmetic mean value, a root mean square value, and a weighted average number of the linear slopes of the sampling signals.

In some examples of the present disclosure, the delay calibration coefficient is correlated to a signal frequency of the calibrated sampling signal, and the correlation is expressed as: configuring the delay calibration coefficient to a default value; and determining whether the signal frequency is a frequency lower than a preset frequency threshold, if an answer is yes, maintaining the delay calibration coefficient unchanged, and if the answer is no, adjusting the delay calibration coefficient to compensate the mismatching delay that is estimated based on the reference channel.

In some examples of the present disclosure, the delay calibration coefficient is configured as a discrete value based on a segment interval of the signal frequency, and the discrete value increases with increase of the signal frequency; or, by performing curve fitting on the delay calibration coefficient corresponding to different signal frequencies, continuous values of the delay calibration coefficient are acquired.

In some examples of the present disclosure, obtaining the calibrated sampling signal output by the current sub-channel based on the calibration slope and the delay calibration coefficient comprises:

$$k_n = (x_n - x_{n-1})/(1 + d_n - d_{n-1}),$$

$$k_{n+1} = (x_{n+1} - x_n)/(1 + d_{n+1} - d_n), \text{ and}$$

$$y_n = x_n - a * d_n * (k_n + k_{n+1})/2,$$

where a represents the delay calibration coefficient, $x_n$ represents an input signal of the current sub-channel to be calibrated, $x_{n-1}$ represents an input signal of a previous sub-channel, $x_{n+1}$ represents an input signal of a next sub-channel, and if $x_n$ is an input signal of a last sub-channel in a current sampling period, $x_{n+1}$ is an input signal of a first sub-channel in a next sampling period; $d_n$ represents the mismatching delay of the current sub-channel, $d_{n-1}$ represents a mismatching delay of the previous sub-channel, $d_{n+1}$ represents a mismatching delay of the next sub-channel, $k_n$ represents a slope between the sub-channel $x_{n-1}$ and the sub-channel $x_n$, $k_{n+1}$ represents a slope between the sub-channel $x_{n+1}$ and the sub-channel $x_n$, and $y_n$ represents the calibrated sampling signal output by the current sub-channel.

A second embodiment of the present disclosure provides a calibration system for sampling time adaptation in a time-interleaved ADC, comprising: a delay estimation module, configured to estimate a mismatching delay of one of sub-channels sampling a same input signal, wherein a first sub-channel among the sub-channels is a reference channel that does not require calibration, and wherein in one sampling period, the mismatching delay of each of the remaining sub-channels is estimated based on the reference channel; a multiplexer module, configured to receive a sampling signal of a current sub-channel to be calibrated from the sub-channels and transmit the sampling signal to a delay calibration module; and the delay calibration module, configured to calculate a calibration slope of the sampling signal of the current sub-channel by using a linear interpolation algorithm, and obtain a calibrated sampling signal output by the current sub-channel based on the mismatching delay of the current sub-channel, the calibration slope and a delay calibration coefficient.

A third embodiment of the present disclosure provides a non-transitory computer-readable storage medium configured to store a computer program. The computer program is executed by a processor to implement the calibration method as described in any one of the examples provided in the first embodiment of the present disclosure.

A fourth embodiment of the present disclosure provides a delay calibrator, comprising a processor and a memory. The memory is configured to store a computer program. The processor is configured to perform the computer program stored in the memory, so that the delay calibrator implements a calibration method as described in any one of the examples provided in the first embodiment of the present disclosure.

As described above, the calibration method, the calibration system, the medium, and the calibrator of the present disclosure have following beneficial effects. The proposed solution of the present disclosure avoids issues like narrow input signal bandwidth or restrictions due to sub-channel sampling rates. The hardware implementation is straightforward and effectively suppresses interference for both low and high-frequency input signals.

BRIEF DESCRIPTION OF DRAWINGS

FIG. 1 is a flowchart of a calibration method for sampling time adaptation in a time-interleaved ADC according to an embodiment of the present disclosure.

FIG. 2 is a schematic diagram illustrating a working timing and sampling time mismatches of four sub-channels of the time-interleaved ADC according to an embodiment of the present disclosure.

DETAILED DESCRIPTION OF THE INVENTION

Figure 3A:
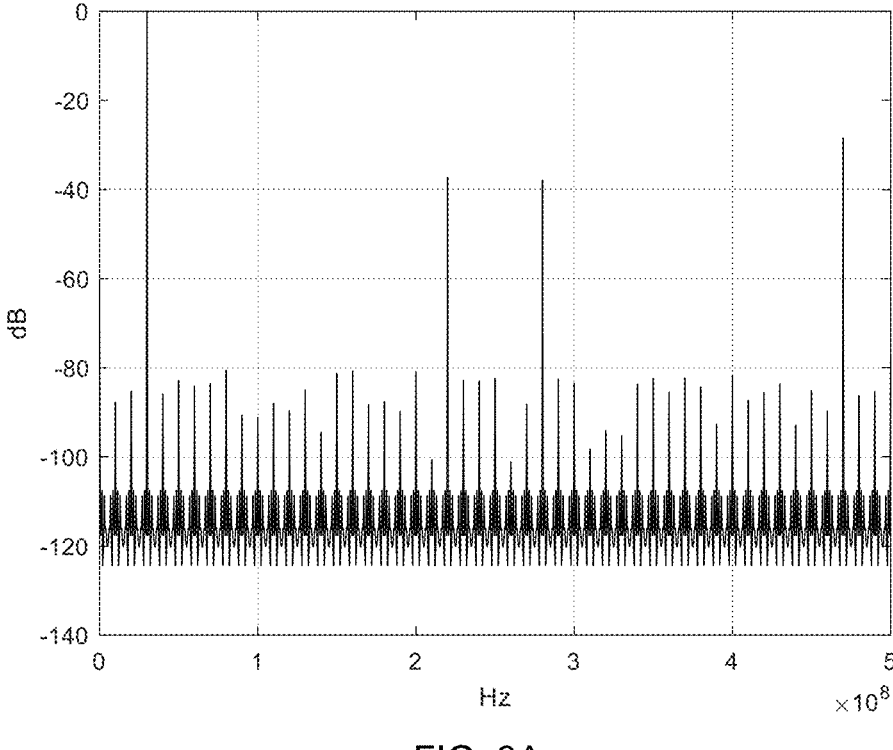
FIG. 3A is a spectrum intensity diagram of uncalibrated sampling data according to an embodiment of the present disclosure.

The embodiments of the present disclosure will be described below. Those skilled can easily understand other advantages and effects of the present disclosure according to contents disclosed by the specification. The present disclosure can also be implemented or applied through other different specific embodiments. Various details in this specification can also be modified or changed based on different viewpoints and disclosures without departing from the spirit of the present disclosure. It should be noted that the following embodiments and features of the following embodiments can be combined with each other if no conflict will result.

In the following description, referring to the accompanying drawings, which describe several embodiments of the present disclosure. It should be understood that other embodiments may be used and that changes in mechanical composition, structure, electrical, and operation may be made without departing from the scope of the present disclosure. The following detailed description should not be considered limiting, and the scope of the embodiments of the present disclosure is limited only by the claims of the patents. The terms used herein are for describing particular embodiments only, and are not intended to limit the present disclosure. Spatially related terms, such as "upper", "lower", "left", "right", "downward", "below", "bottom", "above", "top", etc., can be used in the text for ease of explanation of the relationship between one element or feature and another element or feature shown in the figure.

In the present disclosure, unless otherwise expressly specified, terms such as "installation", "connection", "coupling", "fixing", and "holding" should be broadly understood. For example, when one element is referred to as being "connected to" another element, one element may be fixedly connected to or detachably connected to another element, may be mechanically connected to or electrically connected to another element, may be directly connected to another element, or may be indirectly connected to another element with another element interposed therebetween. These two elements may also communicate with each other internally. Those of ordinary skill in the art can understand the specific meanings of the above terms in the present disclosure according to specific situations.

Furthermore, as used herein, the singular forms "one", "a/an" and "the" are intended to include the plural form, unless the context indicates otherwise. It should be further understood that the terms "include" and "comprise" indicate the existence of the described features, steps, operations, elements, components, items, categories, and/or groups, but do not exclude the existence, presence, or addition of one or more other features, steps, operations, elements, components, items, categories, and/or groups. As used herein, the terms "or" and "and/or" are inclusive, and are used to include any of the associated listed items and all combinations thereof. Thus, "A, B or C" or "A, B and/or C" means "any of the following: A; B; C; A and B; A and C; B and C; A, B and C". Exceptions to this definition apply only when combinations of elements, functions or operations are inherently paradoxical in some way.

To address the issues in the background, the present disclosure provides a calibration method and a calibration system 400 for sampling time adaptation in a time-interleaved ADC, a medium, and a calibrator, which adopt linear interpolation principles, avoiding the need for high-order filters, making the hardware easier to implement. This method offers excellent interference suppression for low-frequency signals and good suppression for high-frequency signals.

In order to meet the inventive purpose, technical solutions and beneficial technical effects of the present disclosure clearer, the present disclosure is described in further details below through the following embodiments in conjunction with the accompanying drawings. It should be noted that the specific embodiments described herein are only illustrative, and are not intended to restrict the present disclosure.

Before diving into the detailed description, the terms and concepts involved in the embodiments of the present disclosure are explained as follows:

<1> Analog to Digital Converter (ADC): A chip used for converting analog signals into digital signals;

<2> Time-Interleaved ADC: The ADC combines multiple processing and clock interleaving. When the first sampling clock signal arrives, the first sampling value is transmitted to ADC0, and when the second sampling clock signal arrives, the second sampling value is transmitted to ADC1, and so on;

<3> Multiplexer: Also known as a data selector, it can choose any data path during transmission as needed. Common types include 4-to-1, 8-to-1 (models like 74151, 74LS151, 74251, 74LS152), and 16-to-1 data selectors (created by connecting two 74151 chips).

FIG. 1 is a flowchart of a calibration method for sampling time adaptation in a time-interleaved ADC according to an embodiment of the present disclosure. The calibration method described herein can be applied to a delay calibration module. This calibration method performs delay calibration through steps S1-S3.

S1 includes receiving a mismatching delay of one of a group of sub-channels sampling a same input signal, wherein in one sampling period, the first sub-channel among the sub-channels is a reference channel that does not require calibration, and the mismatching delay of each of the remaining sub-channels is estimated based on the reference channel.

To make the description easier to follow and to aid understanding by those skilled in the art, an example of a time-interleaved ADC with four sub-channels is used in the following explanation. The actual applications of the embodiments of the present disclosure are not limited to just four sub-channels.

FIG. 2 is a schematic diagram illustrating a working timing and sampling time mismatches of four sub-channels of the time-interleaved ADC according to an embodiment of the present disclosure. In FIG. 2, fs represents a sampling rate of the time-interleaved ADC, T represents the sampling period, ADC0 serves as a reference channel, and dt1, dt2, and dt3 are sampling time mismatches of channels of ADC1, ADC2 and ADC3, respectively.

Assume that in the first sampling period, the outputs of the four sub-channels are x0, x1, x2, and x3 sequentially, and in the second sampling period, the outputs are x4, x5, x6, and x7 sequentially. The corresponding outputs of the delay calibration module are y0-y7. Since ADC0 is the reference channel, sampling results of the first sub-channel (x0 and x4) do not need calibration, so y0=x0 and y4=x4. Only sampling results of the other sub-channels require calibration.

In the present disclosure, the calibration method further comprises taking a ratio of a delay time to the sampling period as the mismatching delay by taking a sampling point as a unit for the mismatching delay. That is, the mismatching delay is measured in sampling points, with the ratio of the delay time to the sampling period used as the mismatching delay. The mismatching delay of the first sub-channel is d0=0, and the mismatching delays of the other sub-channels are measured in sampling points, described as follows: d1=dt1/T, d2=dt2/T, and d3=dt3/T.

S2 includes receiving a sampling signal of a current sub-channel to be calibrated, wherein the current sub-channel is selected by a multiplexer.

In one embodiment of the present disclosure, each of the input terminals of the multiplexer are electrically connected to one of the sub-channels, and an output terminal of the multiplexer selects the current sub-channel.

S3 includes calculating a calibration slope of the sampling signal of the current sub-channel by using a linear interpolation algorithm and based on a mismatching delay corresponding to the current sub-channel; and obtaining a calibrated sampling signal output by the current sub-channel based on the calibration slope and a delay calibration coefficient.

In one embodiment of the present disclosure, calculating the calibration slope of the sampling signal of the current sub-channel comprises: obtaining a linear slope of a sampling signal of a previous sub-channel and a linear slope of a sampling signal of a next sub-channel, respectively; and calculating a characteristic value of the linear slope of the sampling signal of the previous sub-channel as a calibration slope of the sampling signal of the previous sub-channel, and a characteristic value of the linear slope of the sampling signal of the next sub-channel as a calibration slope of the sampling signal of the next sub-channel, respectively.

Optionally, obtaining the characteristic values of the linear slopes of the sampling signals of the previous and next sub-channels comprises: calculating one or more of an arithmetic mean value, a root mean square value, and a weighted average number of the linear slopes of the sampling signals. In the following description, the arithmetic mean value is used as the characteristic value for explanation.

In the present disclosure, the delay calibration coefficient is related to a signal frequency of the calibrated sampling signal. The signal frequency of the calibrated sampling signal output by the delay calibration module is used to determine a corresponding delay calibration coefficient.

Further, the correlation between the delay calibration coefficient and the signal frequency of the calibrated sampling signal is expressed as: configuring the delay calibration coefficient to a default value; and determining whether the signal frequency is a frequency lower than a preset frequency threshold, if yes, maintaining the delay calibration coefficient unchanged, and if no, adjusting the delay calibration coefficient to compensate the mismatching delay that is estimated based on the reference channel.

By default, the delay calibration coefficient is set to 1. If the signal frequency is lower than or equal to the preset frequency threshold (indicating a low signal frequency), there is no need to adjust the delay calibration coefficient. If the signal frequency exceeds the preset frequency threshold (indicating a high signal frequency), the delay calibration coefficient needs adjustment to compensate for the mismatching delay that is estimated based on the reference channel.

In some embodiments, the signal frequency of the calibrated sampling signal can be determined using a zero-crossing detection algorithm. The zero-crossing detection algorithm counts the number of sampling points between two consecutive zero crossings in the same direction within an AC system, or accumulates the number of sampling points over N sampling periods. The signal frequency is then calculated based on a corresponding sampling frequency.

For the delay calibration coefficient, it's preferable to pre-select several frequency test points. Using simulation or actual measurements, the delay calibration coefficient is adjusted to better suppress interference components in the spectrum after performing a fast fourier transform (FFT) on output data (i.e., calibrated sampling data), establishing a correlation between the signal frequency and the delay calibration coefficient. Test results can then be segmented or fitted, allowing real-time adjustment of the delay calibration coefficient based on the signal frequency in practical applications.

In some embodiments, the delay calibration coefficient is configured as discrete values based on a segment interval of the signal frequency, and the discrete values increase with the increase of the signal frequency. For example, taking a signal frequency of 0-100 MHz as an example, a delay calibration coefficient in an interval of 0-20 MHz may be set as a default value 1.0; a delay calibration coefficient in an interval of 20-40 MHz may be set as a default value 1.1; a delay calibration coefficient in an interval of 40-80 MHz may be set as a default value 1.3; and a delay calibration coefficient in an interval of 80-100 MHz may be set as a default value 1.5. Note that these are illustrative examples and do not restrict the actual segmentation method or coefficient values.

In some embodiments, by performing a curve fitting on the delay calibration coefficient corresponding to different signal frequencies, a continuous value of the delay calibration coefficient is acquired by fitting into the curve generated from discrete values. For example, within a 0-100 MHz range, certain continuous values of the delay calibration coefficient are produced after undergoing curve fitting from a discrete curve, allowing any signal frequency within this range to have a corresponding value of its delay calibration coefficient.

In one embodiment of the present disclosure, the obtaining of the calibrated sampling signal output by the current sub-channel based on the calibration slope and the delay calibration coefficient comprises:

$$k_n = (x_n - x_{n-1})/(1 + d_n - d_{n-1}),\qquad\text{Formula 1}$$

$$k_{n+1} = (x_{n+1} - x_n)/(1 + d_{n+1} - d_n),\text{ and}\qquad\text{Formula 2}$$

$$y_n = x_n - a * d_n * (k_n + k_{n+1})/2,\qquad\text{Formula 3}$$

where a represents the delay calibration coefficient, $x_n$ represents an input signal of the current sub-channel to be calibrated, $x_{n-1}$ represents an input signal of a previous sub-channel, $x_{n+1}$ represents an input signal of a next sub-channel, and if $x_n$ is an input signal of a last sub-channel in a current sampling period, $x_{n+1}$ is an input signal of a first sub-channel in a next sampling period; $d_n$ represents the mismatching delay of the current sub-channel, $d_{n-1}$ represents a mismatching delay of the previous sub-channel, $d_{n+1}$ represents a mismatching delay of the next sub-channel, $k_n$ represents a slope between the sub-channel $x_{n-1}$ and the sub-channel $x_n$, $k_{n+1}$ represents a slope between the sub-channel $x_{n+1}$ and the sub-channel $x_n$, and $y_n$ represents the calibrated sampling signal output by the current sub-channel.

Taking the sub-channel 1 as a current sub-channel to be calibrated as an example, specific calibration formulas are as follows:

$$k1 = (x1 - x0)/(1 + d1 - d0),\qquad\text{Formula 4}$$

$$k2 = (x2 - x1)/(1 + d2 - d1),\text{ and}\qquad\text{Formula 5}$$

$$y1 = x1 - a * d1 * (k1 + k2)/2,\qquad\text{Formula 6}$$

where x0 represents an input signal of a sub-channel 0, x1 represents an input signal of a sub-channel 1, and x2 represents an input signal of a sub-channel 2; d0 represents a mismatching delay of the sub-channel 0 (since sub-channel 0 is a reference channel, d0 has a value of 0), d1 represents a mismatching delay of the sub-channel 1, and d2 represents a mismatching delay of the sub-channel 2; k1 represents a slope between the sub-channel 0 and the sub-channel 1, k2 represents a slope between the sub-channel 1 and the sub-channel 2, a represents the delay calibration coefficient, and y1 represents a calibrated sampling signal output by the sub-channel 1.

Taking the sub-channel 2 as a current sub-channel to be calibrated as an example, specific calibration formulas are as follows:

$$k1 = (x2 - x1)/(1 + d2 - d1),\qquad\text{Formula 7}$$

$$k2 = (x3 - x2)/(1 + d3 - d2),\text{ and}\qquad\text{Formula 8}$$

$$y2 = x2 - a * d2 * (k1 + k2)/2,\qquad\text{Formula 9}$$

where x1 represents the input signal of the sub-channel 1, x2 represents the input signal of the sub-channel 2, and x3 represents the input signal of the sub-channel 3; d1 represents the mismatching delay of the sub-channel 1, d2 represents the mismatching delay of the sub-channel 2, and d3 represents the mismatching delay of the sub-channel 3; k1 represents a slope between the sub-channel 1 and the sub-channel 2, k2 represents a slope between the sub-channel 2 and the sub-channel 3, a represents the delay calibration coefficient, and y2 represents a calibrated sampling signal output by the sub-channel 2.

Taking the sub-channel 3 as a current sub-channel to be calibrated as an example, specific calibration formulas are as follows:

$$k1 = (x3 - x2)/(1 + d3 - d2),\qquad\text{Formula 10}$$

$$k2 = (x4 - x3)/(1 + d4 - d3),\text{ and}\qquad\text{Formula 11}$$

$$y3 = x2 - a * d2 * (k1 + k2)/2,\qquad\text{Formula 12}$$

where x2 represents the input signal of the sub-channel 2, x3 represents the input signal of the sub-channel 3, and x4 represents an input signal of a sub-channel 0 in a next sampling period; d2 represents the mismatching delay of the sub-channel 2, d3 represents the mismatching delay of the sub-channel 3, d4 represents a mismatching delay of the sub-channel 0 in the next sampling period, and since the sub-channel 0 is the reference channel, d0 has a value of 0; k1 represents a slope between the sub-channel 2 and the sub-channel 3, k2 represents a slope between the sub-channel 3 and the sub-channel 0, a represents the delay calibration coefficient, and y3 represents a calibrated sampling signal output by the sub-channel 3.

At this point, data from one sampling period for all four sub-channels have been calibrated. This process is then repeated for subsequent sampling periods, thereby achieving mismatching delay calibration.

Figure 3B:
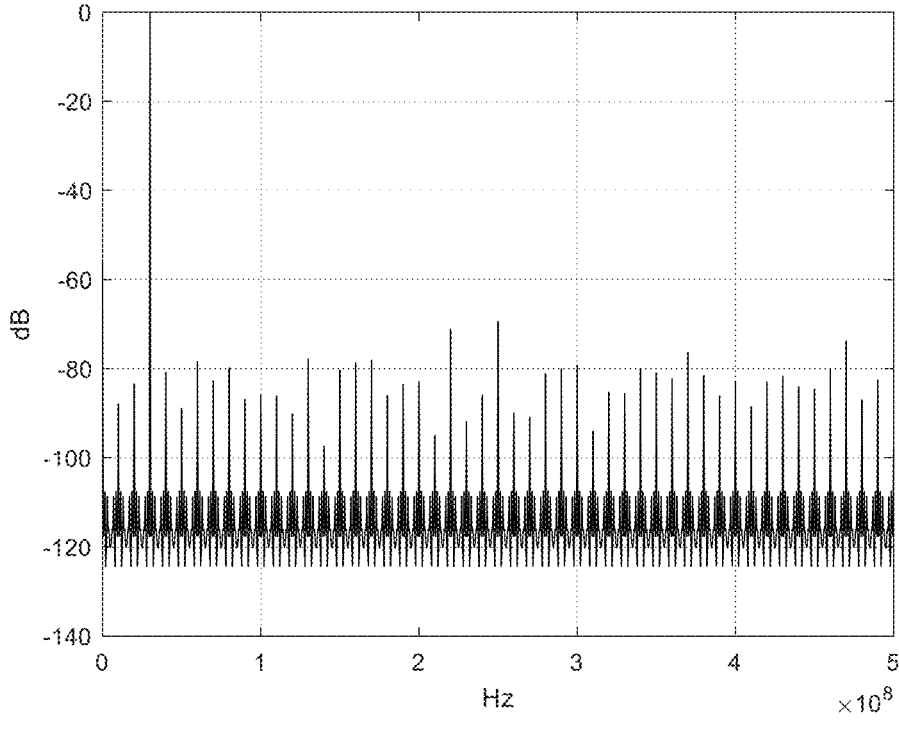
FIG. 3B is a spectrum intensity diagram of calibrated sampling data according to an embodiment of the present disclosure.

FIG. 3A is the spectrum intensity diagram of uncalibrated sampling data according to an embodiment of the present disclosure. FIG. 3B is the spectrum intensity diagram of calibrated sampling data according to the embodiment of the present disclosure. Taking a time-interleaved ADC with a 1 GHz sampling rate as an example, with each of the 4 sub-channels having a sampling rate of 250 MHz, and for a 30 MHz input signal, FIG. 3A shows the spectrum intensity of the sampling data before calibration, and FIG. 3B shows the spectrum intensity of the sampling data after calibration. From FIGS. 3A and 3B, it's evident that after delay calibration, the interference components in the spectrum are significantly suppressed, thus improving the performance of the time-interleaved ADC.

The above description has provided a detailed explanation of the calibration method. The following sections will further explain the calibration system, terminal, and medium provided by the present disclosure by using more specific embodiments.

Figure 4:
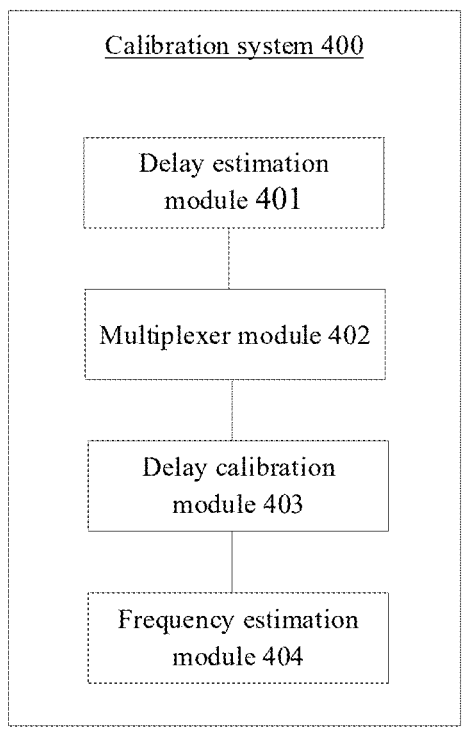
FIG. 4 is a schematic block diagram of a calibration system for sampling time adaptation in the time-interleaved ADC according to an embodiment of the present disclosure.

FIG. 4 is a schematic diagram of the calibration system 400 for sampling time adaptation in the time-interleaved ADC according to one embodiment of the present disclosure. The calibration system 400 comprises a delay estimation module 401, a multiplexer module 402, and a delay calibration module 403.

The delay estimation module 401 is configured to estimate a mismatching delay of some of the sub-channels sampling the same input signal. In one sampling period, a first sub-channel among the sub-channels is the reference channel that does not require calibration, and the mismatching delay of each of the remaining sub-channels is estimated based on the reference channel.

The multiplexer module 402 is configured to receive a sampling signal of the remaining sub-channel from other non-reference channels, call it the current sub-channel, to be calibrated from the sub-channels and transmit the sampling signal to the delay calibration module 403.

In one embodiment of the present disclosure, each of the input terminals of the multiplexer module 402 is electrically connected to one of the sub-channels, and an output terminal of the multiplexer module 402 selects the current sub-channel.

The delay calibration module 403 is configured to calculate a calibration slope of the sampling signal of the current sub-channel by using a linear interpolation algorithm; and based on the mismatching delay corresponding to the current sub-channel, the delay calibration module 403 obtains a calibrated sampling signal output by the current sub-channel based on the calibration slope and a delay calibration coefficient.

In one embodiment of the present disclosure, calculating the calibration slope of the sampling signal from the current sub-channel comprises: obtaining a linear slope of a sampling signal of a previous (if it has one) sub-channel and a linear slope of a sampling signal of a next (if it has one) sub-channel, respectively; and calculating a characteristic value of the linear slope of the sampling signal of the previous sub-channel as a calibration slope of the sampling signal of the previous sub-channel, and a characteristic value of the linear slope of the sampling signal of the next sub-channel as a calibration slope of the sampling signal of the next sub-channel, respectively.

Optionally, the obtaining of the characteristic values of the linear slopes of the sampling signals of the previous and next sub-channels comprises: calculating one or more of an arithmetic mean value, a root mean square value, and a weighted average number of the linear slopes of the sampling signals.

In one embodiment of the present disclosure, the obtaining of the calibrated sampling signal output by the current sub-channel based on the calibration slope and the delay calibration coefficient comprises:

$$k_n = (x_n - x_{n-1})/(1 + d_n - d_{n-1}), \qquad \text{Formula 1}$$

$$k_{n+1} = (x_{n+1} - x_n)/(1 + d_{n+1} - d_n), \text{ and} \qquad \text{Formula 2}$$

$$y_n = x_n - a * d_n * (k_n + k_{n+1})/2, \qquad \text{Formula 3}$$

where a represents the delay calibration coefficient, $x_n$ represents an input signal of the current sub-channel to be calibrated, $x_{n-1}$ represents an input signal of a previous sub-channel, and $x_{n+1}$ represents an input signal of a next sub-channel; $d_n$ represents the mismatching delay of the current sub-channel, $d_{n-1}$ represents a mismatching delay of the previous sub-channel, $d_{n+1}$ represents a mismatching delay of the next sub-channel, $k_n$ represents a slope between the sub-channel $x_{n-1}$ and the sub-channel $x_n$, $k_{n+1}$ represents a slope between the sub-channel $x_{n+1}$ and the sub-channel $x_n$, and $y_n$ represents the calibrated sampling signal output by the current sub-channel.

In one embodiment of the present disclosure, the calibration system 400 further comprises a frequency estimation module 404. The frequency estimation module 404 is configured such that the calibrated sampling signal output by the delay calibration module serves as the input signal. The frequency estimation module 404 outputs a delay calibration coefficient related to the signal frequency.

Further, the correlation between the delay calibration coefficient output by the frequency estimation module 404 and the signal frequency of the calibrated signal is expressed as: configuring the delay calibration coefficient to a default value; and determining whether the signal frequency is a frequency lower than the preset frequency threshold, if the answer is yes, maintaining the delay calibration coefficient unchanged, and if the answer is no, adjusting the delay calibration coefficient to compensate the mismatching delay that is estimated based on the reference channel.

By default, the delay calibration coefficient is set to 1. If the signal frequency is lower than or equal to the preset frequency threshold (indicating a low signal frequency), there is no need to adjust the delay calibration coefficient. If the signal frequency exceeds the preset frequency threshold (indicating a high signal frequency), the delay calibration coefficient needs adjustment to compensate for the mismatching delay that is estimated based on the reference channel.

For the delay calibration coefficient, it's preferable to pre-select several frequency test points. Using simulation or actual measurements, the delay calibration coefficient is adjusted to better suppress the interference components in the spectrum after performing a fast fourier transform (FFT) on output spectrum intensity data (i.e., calibrated sampling data), establishing a correlation between the signal frequency and the delay calibration coefficient. Test results can then be segmented or fitted, allowing real-time adjustment of the delay calibration coefficient based on the signal frequency in practical applications.

In some embodiments, the delay calibration coefficient is configured as discrete values based on a segment interval of the signal frequency, and the discrete values increase with the increase of the signal frequency. For example, taking a signal frequency of 0-100 MHz as an example, a delay calibration coefficient in an interval of 0-20 MHz may be set as a default value 1.0; a delay calibration coefficient in an interval of 20-40 MHz may be set as a default value 1.1; a delay calibration coefficient in an interval of 40-80 MHz may be set as a default value 1.3; and a delay calibration coefficient in an interval of 80-100 MHz may be set as a default value 1.5. Note that these are illustrative examples and do not restrict the actual segmentation method or coefficient values.

In some embodiments, by performing the curve fitting on the delay calibration coefficient corresponding to different signal frequencies, a continuous value of the delay calibration coefficient is acquired. For example, within a 0-100 MHz range, certain discrete values of the delay calibration coefficient undergo the curve fitting to produce a continuous curve, allowing any signal frequency within this range to have a corresponding value of the delay calibration coefficient.

Calibration devices for sampling time adaptation in the time-interleaved ADC, provided in the above embodiments, are described through the division of program modules for illustration purposes. In practical applications, these processes can be allocated to different program modules as needed. This means the internal structure of the system can comprise various program modules to complete all or part of the described processes. Additionally, the calibration system and the calibration method of the present disclosure are based on the same concept. The specific implementation process is detailed in the method embodiments, which will not be repeated here.

Figure 5:
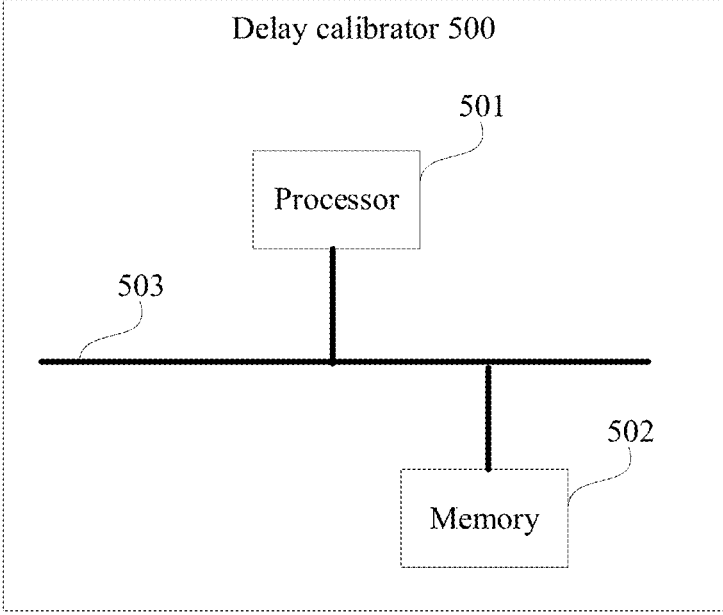
FIG. 5 is a schematic block diagram of a delay calibrator according to an embodiment of the present disclosure.

The calibration method of the present disclosure can be implemented on either a terminal side or a server side. For an overview of a hardware structure of a delay calibrator 500 for sampling time adaptation in the time-interleaved ADC, please refer to FIG. 5, which illustrates an exemplary hardware configuration of the delay calibrator 500 according to another embodiment of the present disclosure. The delay calibrator 500 comprises at least one processor 501 and one memory 502. Various components of the delay calibrator 500 are coupled together through a bus system 503. It should be understood that the bus system 503 is configured to implement connection and communication between these components. In addition to a data bus, the bus system 503 further comprises a power bus, a control bus, and a status signal bus. Here for a simple representation, various buses are marked as a bus system 503 in FIG. 5.

The memory 502 can be either volatile or non-volatile memory, or a combination of both. Non-volatile memory can include read-only memory (ROM), programmable read-only memory (PROM), used as external high-speed cache. Examples of random-access-memory (RAM) include static random-access memory (SRAM) and synchronous static random-access memory (SSRAM). The memory 502 of the present disclosure includes, but is not limited to, these types and any other suitable memory types. The memory 502 stores various types of data to support the operation of the delay calibrator 500 (i.e., calibration terminal) for sampling time adaptation in the time-interleaved ADC.

The calibration method of the present disclosure can be executed by the processor 501, which may be an integrated circuit chip with signal processing capabilities. In the implementation process, each operation of the above method may be completed by an integrated logic circuit of hardware in the processor 501 or an instruction in a form of software. The processor 501 can be a general-purpose processor, digital signal processor (DSP), or other programmable logic devices (PLDs), discrete gates, transistor logic devices, or discrete hardware components. The processor 501 can implement or execute the methods, steps, and logic diagrams disclosed in the present disclosure. The general-purpose processor can be a microprocessor or any conventional processor. The steps of the calibration method of the present disclosure can be executed directly by a hardware decoder processor, or by a combination of hardware and software modules. Software modules can reside in a storage medium, which is part of the memory. The processor reads the information from the memory and, together with its hardware, executes the steps of the described method.

In an exemplary embodiment, the delay calibrator 500 comprises one or more of application-specific-integrated-circuits (ASICs), DSPs, programmable logic devices, and complex programmable logic devices (CPLDs), to perform the described method.

It may be appreciated by those of ordinary skill in the art that all or some of the steps that implement the method embodiments described above may be accomplished by hardware related to computer programs. The computer program may be stored in a computer readable storage medium. Operations of the aforementioned methods are performed when the program is executed; and the aforementioned storage media includes an ROM, an RAM, a magnetic disk, an optical disk, or any of other various media that can store software programs.

In the embodiments provided herein, the computer readable and writeable storage medium may include read-only memory, random access memory, EEPROM, CD-ROM or other optical disk storage device, disk storage device or other magnetic storage device, flash memory, USB flash disk, removable hard disk, or any other medium capable of storing desired program code in the form of instructions or data structures and capable of being accessed by a computer. Alternatively, any connection may be appropriately referred to as a computer readable medium. For example, if instructions are sent from a website, server, or other remote source using coaxial cable, fiber optic cable, twisted pair, digital subscriber line (DSL), or wireless technology such as infrared, radio, and microwave, the coaxial cable, fiber optic cable, twisted pair, DSL, or wireless technology such as infrared, radio, and microwave are included in the definition of the medium. However, it should be understood that computer readable and writeable storage medium and data storage medium do not include connections, carriers, signals, or other transient media, but are intended for non-transient, tangible storage medium. As used in the present disclosure, disks and optical discs include compressed compact discs (CDs), laser discs, optical disks, digital versatile discs (DVDs), floppy disks, and Blu-ray discs, wherein data in disks are typically replicated magnetically, and data in optical discs are replicate optically with lasers.

As described above, the calibration method, the calibration system, the medium, and the calibrator of the present disclosure have following beneficial effects. The proposed solution of the present disclosure avoids issues like narrow input signal bandwidth or restrictions due to sub-channel sampling rates. The hardware implementation is straightforward and effectively suppresses interference for both low and high-frequency input signals. Therefore, the present disclosure effectively overcomes various shortcomings of the prior art and has a high industrial value.

The above-mentioned embodiments only exemplarily illustrate the principles and effects of the present disclosure, but are not used to limit the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A calibration method for sampling time adaptation in a time-interleaved analog-to-digital-converter (ADC), comprising:

receiving a mismatching delay of one of sub-channels in the ADC sampling a same input signal, wherein a first sub-channel among the sub-channels is a reference channel that does not require calibration, and wherein in one sampling period, the mismatching delay of each of the remaining sub-channels is estimated based on the reference channel, and acquiring a mismatching delay by taking a ratio of a delay time to the sampling period, wherein the mismatching delay uses a sampling point as a unit;

receiving a sampling signal of a current sub-channel to be calibrated, wherein the current sub-channel is selected by a multiplexer; and calculating a calibration slope of the sampling signal of the current sub-channel by using a linear interpolation algorithm, and obtaining a calibrated sampling signal output by the current sub-channel, based on the mismatching delay of the current sub-channel, the calibration slope and a delay calibration coefficient, wherein calculating the calibration slope of the sampling signal of the current sub-channel comprises:

obtaining a linear slope of a sampling signal of a previous sub-channel and a linear slope of a sampling signal of a next sub-channel, respectively; and calculating a characteristic value of the linear slope of the sampling signal of the previous sub-channel as a calibration slope of the sampling signal of the previous sub-channel, and a characteristic value of the linear slope of the sampling signal of the next sub-channel as a calibration slope of the sampling signal of the next sub-channel, respectively;

wherein obtaining the calibrated sampling signal output by the current sub-channel based on the calibration slope and the delay calibration coefficient comprises:

$$k_n = (x_n - x_{n-1})/(1 + d_n - d_{n-1}),$$

$$k_{n+1} = (x_{n+1} - x_n)/(1 + d_{n+1} - d_n), \text{ and}$$

$$y_n = x_n - a * d_n * (k_n + k_{n+1})/2,$$

where $\alpha$ represents the delay calibration coefficient, $x_n$ represents an input signal of the current sub-channel to be calibrated, $x_{n-1}$ represents an input signal of a previous sub-channel, $x_{n+1}$ represents an input signal of a next sub-channel, and if $x_n$ is an input signal of a last sub-channel in a current sampling period, $x_{n+1}$ is an input signal of a first sub-channel in a next sampling period; $d_n$ represents the mismatching delay of the current sub-channel, $d_{n-1}$ represents a mismatching delay of the previous sub-channel, $d_{n+1}$ represents a mismatching delay of the next sub-channel, $k_n$ represents a slope between the sub-channel $x_{n-1}$ and the sub-channel $x_n$, $k_{n+1}$ represents a slope between the sub-channel $x_{n+1}$ and the sub-channel $x_n$, and $y_n$ represents the calibrated sampling signal output by the current sub-channel.

2. The calibration method according to claim 1, wherein obtaining the characteristic values of the linear slopes of the sampling signals of the previous and next sub-channels comprises:

calculating one or more of an arithmetic mean value, a root mean square value, and a weighted average number of the linear slopes of the sampling signals.

3. The calibration method according to claim 1, the delay calibration coefficient is correlated to a signal frequency of the calibrated sampling signal, and the correlation is expressed as:

configuring the delay calibration coefficient to a default value; and determining whether the signal frequency is a frequency lower than a preset frequency threshold, if an answer is yes, maintaining the delay calibration coefficient unchanged, and if the answer is no, adjusting the delay calibration coefficient to compensate the mismatching delay that is estimated based on the reference channel.

4. The calibration method according to claim 3, wherein the delay calibration coefficient is configured as a discrete value based on a segment interval of the signal frequency, and the discrete value increases with increase of the signal frequency;

or, wherein by performing curve fitting on the delay calibration coefficient of different signal frequencies, continuous values of the delay calibration coefficient are acquired.

5. A calibration system for sampling time adaptation in a time-interleaved ADC, comprising:

a delay estimation module, which estimates a mismatching delay of one of sub-channels sampling a same input signal, wherein a first sub-channel among the sub-channels is a reference channel that does not require calibration, and wherein in one sampling period, the mismatching delay of each of the remaining sub-channels is estimated based on the reference channel, wherein a mismatching delay is acquired by taking a ratio of a delay time to the sampling period, and the mismatching delay uses a sampling point as a unit;

a multiplexer module, which receives a sampling signal of a current sub-channel to be calibrated from the sub-channels and transmits the sampling signal to a delay calibration module; and the delay calibration module, which calculates a calibration slope of the sampling signal of the current sub-channel by using a linear interpolation algorithm, and obtains a calibrated sampling signal output by the current sub-channel based on the mismatching delay of the current sub-channel, the calibration slope and a delay calibration coefficient, wherein calculating the calibration slope of the sampling signal of the current sub-channel comprises:

obtaining a linear slope of a sampling signal of a previous sub-channel and a linear slope of a sampling signal of a next sub-channel, respectively; and calculating a characteristic value of the linear slope of the sampling signal of the previous sub-channel as a calibration slope of the sampling signal of the previous sub-channel, and a characteristic value of the linear slope of the sampling signal of the next sub-channel as a calibration slope of the sampling signal of the next sub-channel, respectively;

wherein obtaining the calibrated sampling signal output by the current sub-channel based on the calibration slope and the delay calibration coefficient comprises:

$$k_n = (x_n - x_{n-1})/(1 + d_n - d_{n-1}),$$

$$k_{n+1} = (x_{n+1} - x_n)/(1 + d_{n+1} - d_n), \text{ and}$$

$$y_n = x_n - a * d_n * (k_n + k_{n+1})/2,$$

where $\alpha$ represents the delay calibration coefficient, $x_n$ represents an input signal of the current sub-channel to be calibrated, $x_{n-1}$ represents an input signal of a previous sub-channel, $x_{n+1}$ represents an input signal of a next sub-channel, and if $x_n$ is an input signal of a last sub-channel in a current sampling period, $x_{n+1}$ is an input signal of a first sub-channel in a next sampling period; $d_n$ represents the mismatching delay of the current sub-channel, $d_{n-1}$ represents a mismatching delay of the previous sub-channel, $d_{n+1}$ represents a mismatching delay of the next sub-channel, $k_n$ represents a slope between the sub-channel $x_{n-1}$ and the sub-channel $x_n$, $k_{n+1}$ represents a slope between the sub-channel $x_{n+1}$ and the sub-channel $x_n$, and $y_n$ represents the calibrated sampling signal output by the current sub-channel.

6. A non-transitory computer-readable storage medium, configured to store a computer program, wherein the computer program is executed by a processor to implement the calibration method according to claim 1.

7. A delay calibrator, comprising a processor and a memory, wherein the memory stores a computer program; and wherein the processor performs the computer program stored in the memory, so that the delay calibrator implements the calibration method according to claim 1.

\* \* \* \* \*